United States Patent [19]
Dawson et al.

[11] Patent Number: 5,854,131
[45] Date of Patent: Dec. 29, 1998

[54] INTEGRATED CIRCUIT HAVING HORIZONTALLY AND VERTICALLY OFFSET INTERCONNECT LINES

[75] Inventors: Robert Dawson, Austin; Mark W. Michael, Cedar Park; Basab Bandyopadhyay, Austin; H. Jim Fulford Jr., Austin; Fred N. Hause, Austin; William S. Brennan, Austin, all of Tex.

[73] Assignee: Advanced Micro Devices, Inc.

[21] Appl. No.: 655,245

[22] Filed: Jun. 5, 1996

[51] Int. Cl.⁶ .................................................. H01L 21/44
[52] U.S. Cl. ........................ 438/666; 438/669; 438/700; 438/624
[58] Field of Search ................... 438/623, 624, 438/637, 675, 666, 669, 700

[56] References Cited

U.S. PATENT DOCUMENTS

| | | |
|---|---|---|
| 5,371,047 | 12/1994 | Greco et al. . |
| 5,482,894 | 1/1996 | Havemann . |
| 5,506,450 | 4/1996 | Lee, et al. . |
| 5,565,384 | 10/1996 | Havemann . |
| 5,733,797 | 3/1998 | Yamaha . |

FOREIGN PATENT DOCUMENTS

| | | |
|---|---|---|
| 0 703 611 | 3/1996 | European Pat. Off. . |
| 4-113625 | 4/1992 | Japan . |

OTHER PUBLICATIONS

Patent Abstracts of Japan, vol. 016, No. 360 (E–1243), Aug. 4, 1992 & JP 04 113625 A (Mitsubishi Electric Corp.), Apr. 15, 1992.

International Search Report for PCT/US 97/02329 mailed Jun. 1997.

Wolf, S, "Silicon Processing for the VLSI Era vol. 2", Lattice Press, Calif. 1990 pp. 230–254.

S. Wolf and R. N. Tauber "Silicon Processing for the VLSI Era vol. 1", Lattice press, Calif. pp. 547–549, 1986.

*Primary Examiner*—Caridad Everhart
*Attorney, Agent, or Firm*—Kevin L. Daffer; Conley, Rose & Tayon

[57] ABSTRACT

An improved multilevel interconnect structure is provided. The interconnect structure includes several levels of conductors, wherein conductors on one level are staggered with respect to conductors on another level. Accordingly, a space between conductors on one level is directly above or directly below a conductor within another level. The staggered interconnect lines are advantageously used in densely spaced regions to reduce the interlevel and intralevel capacitance. Furthermore, an interlevel and an intralevel dielectric structure includes optimally placed low K dielectrics which exist in critical spaced areas to minimize capacitive coupling and propagation delay problems. The low K dielectric, according to one embodiment, includes a capping dielectric which is used to prevent corrosion on adjacent metallic conductors, and serves as an etch stop when conductors are patterned. The capping dielectric further minimizes the overall intrinsic stress of the resulting intralevel and interlevel dielectric structure.

10 Claims, 3 Drawing Sheets

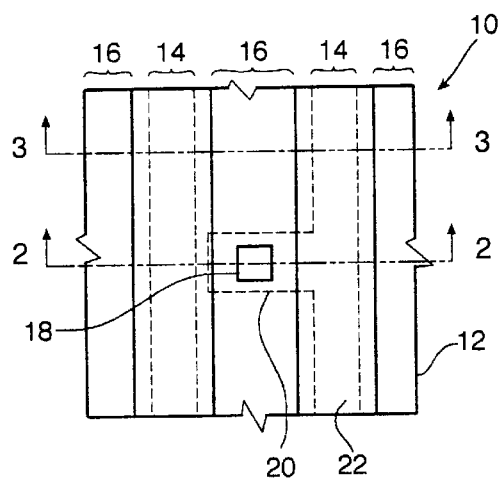
FIG. 1
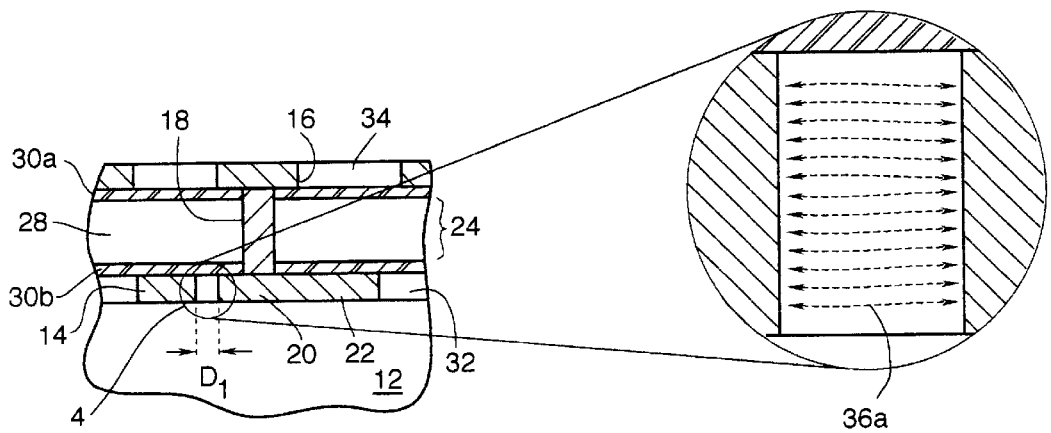
FIG. 2
FIG. 4
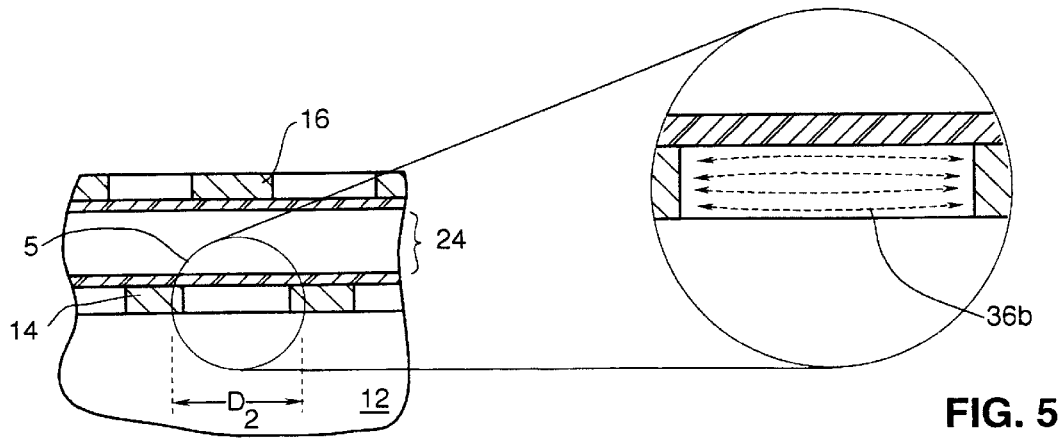
FIG. 3
FIG. 5

INTEGRATED CIRCUIT HAVING HORIZONTALLY AND VERTICALLY OFFSET INTERCONNECT LINES

BACKGROUND OF THE INVENTION

1. Field of the Invention

This invention relates to semiconductor fabrication and more particularly to an integrated circuit which employs a multilevel interconnect structure. The interconnect structure includes interconnect lines which are vertically and horizontally spaced from each other by an intralevel and an interlevel dielectric structure having a low dielectric constant. By offsetting or staggering interconnect lines relative to each other on dissimilar topological levels, a higher density interconnect structure can be produced with minimal electric field coupling between the interconnect lines.

2. Description of the Relevant art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend partially parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are covered by a dielectric material. The layers of conductors overlaid with a dielectric present a topography upon which a subsequent layer of conductors can be patterned.

Conductors are made from an electrically conductive material; a suitable material includes Al, Ti, Ta, W, Mo, polysilicon, or a combination thereof. Substrate includes any type of material which can retain dopant ions and the isolated conductivity regions brought about by those ions. Typically, substrate is a silicon-based material which receives p-type or n-type ions.

Generally speaking, interconnect lines (or conductors) are fashioned upon the topography and dielectrically spaced above an underlying conductor or substrate by a dielectric thickness $T_{d1}$. Each conductor is dielectrically spaced from other conductors within the same level of conductors (i.e., substantially coplanar conductors) by a distance $T_{d2}$. Accordingly, capacitance between vertically spaced conductors, or interlevel capacitance $C_{LS}$ is determined as follows:

$$C_{LS} \approx eW_L L/T_{d1} \qquad \text{(Eq. 1)}$$

Further, capacitance between horizontally spaced, substantially coplanar conductors, or intralevel capacitance $C_{LL}$ is determined as follows:

$$C_{LL} \approx eT_c L/T_{d2} \qquad \text{(Eq. 2)}$$

, where e is the permitivity of the dielectric material (the dielectric material between the conductor and substrate or the dielectric material between conductors), $W_L$ is the conductor width, and L is the conductor length. Resistance of the conductor is calculated as follows:

$$R=(rL)/W_L T_c \qquad \text{(Eq. 3)}$$

, where r represents resistivity of the conductive material, and $T_c$ is the interconnect thickness. Combinations of equations 1 and 3, and/or equations 2 and 3 indicate as follows the propagation delay or coupling of a conductor to an adjacent conductor:

$$RC_{LS} \approx reL^2/T_c T_{d1}$$

$$RC_{LL} \approx reL^2/W_L T_{d2}$$

Propagation delay is an important characteristic of an integrated circuit since it limits the speed (frequency) at which the circuit or circuits can operate. The shorter the propagation delay, the higher the speed of the circuit or circuits. It is therefore important that propagation delay and/or capacitive coupling be minimized as much as possible given the geometric constraints of the semiconductor topography.

Propagation delay is shown to be a function of both capacitance $C_{LS}$ as well as capacitance $C_{LL}$. Accordingly, propagation delay is determined by parasitic capacitance values between conductors spaced on the same horizontal level ($C_{LL}$), and parasitic capacitance values between conductors spaced on different horizontal levels ($C_{LS}$). As circuit density increases, lateral spacing as well as vertical spacing between conductors decreases, and $C_{LL}$ and $C_{LS}$ deleteriously affect high speed signals forwarded through conductors within a bus. Minimum spacing between conductors on the same level is generally mandated by minimum spacing rules which have steadily decreased over the years. Moreover, planarization techniques and small aspect ratios of level-to-level contacts have forced thin interlevel dielectrics and thereby have decreased the vertical spacing between conductors. A trend, therefore, has been toward reducing both vertical and horizontal spacing between conductors to achieve a dense multilevel interconnect structure associated with VLSI applications.

Increases in parasitic capacitance pose two major problems. First, an increase in parasitic capacitance generally causes an increase in the time at which a transition on the one end of the conductor occurs at the other end. Increase in transition time (i.e., increase in speed degradation) thereby requires a longer drive period. If the conductor extends across a critical speed path, speed degradation on the line will jeopardize functionality of the overall circuit. Second, a larger parasitic capacitance causes an increase in crosstalk noise. A conductor which does not transition nonetheless receives crosstalk noise from neighboring lines which do. Increase in transition time and crosstalk noise is primarily a function of the geometric space between conductors as well as the dielectric constant (permittivity) of the interposed dielectric. Closely spaced conductors experience a greater fringing field effect than sparsely spaced conductors, regardless of the dielectric constant. Therefore, while it would be beneficial to produce a dielectric having a low dielectric constant, the dielectric must also be sufficiently large in lateral size and thickness in order to optimally minimize fringing fields between conductors.

It is thereby important to minimize propagation delay especially in critical speed paths and/or between conductors which are spaced close to one another. A need arises for reducing propagation delay and cross coupling noise by somehow maximizing the amount of dielectric between conductors and minimizing the dielectric constant of dielectric in critical areas directly between those conductors. The desired configuration must be one which provides maximum lateral and vertical spacing between densely arranged conductors, and also provides optimal dielectric material with low dielectric constant in critical areas.

SUMMARY OF THE INVENTION

The problems outlined above are in large part solved by an improved multilevel interconnect structure. The interconnect structure includes staggered interconnect lines formed in areas where interconnect lines are densely spaced. The interconnect lines are staggered by forming one interconnect line in a plane dissimilar from and laterally spaced between a pair of interconnect lines. The interconnect line is thereby formed directly above or directly below a space between a pair of interconnect lines arranged on an elevational level dissimilar from the interconnect line. Staggering the interconnect lines is beneficial in increasing the overall distance between conductors by shifting the conductors on dissimilar levels to diagonal positions relative to each other rather than one conductor being a spaced distance directly above the other. Increase in vertical spacing helps reduce $C_{LS}$. Increase in vertical spacing does not come at an expense of horizontal spacing between conductors on the same level. Thus, $C_{LL}$ is maintained.

According to one embodiment, contact between conductors on dissimilar levels, using the staggered configuration, is carried forth by extending a pad portion from a conductor to the space between that conductor and an adjacent conductor. The pad portion extends coplanar to all other conductors within that level, and is aligned directly beneath a dielectrically spaced upper level conductor. The pad portion thereby serves to receive a contact emanating from the pad structure to a dielectrically spaced upper conductor arranged directly over the pad portion. Accordingly, a select set of conductors within one plane can comprise pad portions which extend from a side of those conductors to a position directly below an upper conductor (or to a position directly above a lower conductor). Accordingly, the staggered configuration affords localized contact between levels of conductors.

According to another embodiment, the multilevel interconnect structure comprises an interlevel dielectric structure placed between two dissimilar levels of interconnect. The dielectric structure is preferably a structure containing dielectric material having a low dielectric constant. The preferred dielectric constant of that material is less than 3.5. The low dielectric constant affords closer vertical and horizontal spacing between conductors while minimizing the fringing field effects between those conductors. Specifically, the low dielectric constant is attributed to materials placed directly between closely spaced conductors—i.e., between vertically and horizontally spaced conductors.

The low dielectric constant material, a suitable material being an organic derivative, is preferably formed into critical spacing areas. First, the organic material is deposited between coplanar conductors within each level of interconnect. Second, the organic material is deposited between the levels of interconnect, i.e., entirely between the planes formed by the interconnect levels. Placement of the low dielectric constant material in the critical areas helps reduce $C_{LS}$ and $C_{LL}$.

According to yet another embodiment, the interlevel dielectric structure comprises not only the organic material deposited between conductors within each level of interconnect as well as between levels of interconnect, but also comprises a capping dielectric. The capping dielectric is formed either as one layer on a surface of the organic material or on both, opposed surfaces of the interposed organic material. The capping dielectric is preferably a chemical vapor deposited (CVD) oxide which serves to offset the relatively large tensile stress attributed to the organic material, once cured. The capping dielectric not only serves to reduce the overall stress of the interlevel dielectric structure, but also provides an adhesion between the adjacent metal conductors and low dielectric constant (low K) dielectric. Still further, the capping layer serves to minimize corrosion upon adjacent metal from the water-yielding low K dielectric (e.g., hygroscopic dielectric).

The present invention contemplates a method for forming a multilevel interconnect structure. The method includes forming a first conductor upon a semiconductor topography. The first conductor comprises an elongated portion and a pad portion extending coplanar with the elongated portion along an axis perpendicular to the elongated portion. An organic material is spin-on deposited upon the first conductor and thereafter cured to form a first dielectric having a dielectric constant less than 3.5. A silane or TEOS based material is then deposited upon the first dielectric to form a second dielectric. Select regions of the first and second dielectric are etched to only the pad portion of the first conductor. The opening formed by etching through a select region thereby comprises a via. The via can then be filled with a metallic material to form a contact having an upper surface commensurate with an upper surface of the second dielectric. A second conductor is then formed in the region directly above the pad portion in electrical communication with the contact.

The present invention further contemplates a multilevel interconnect structure comprising a plurality of coplanar first conductors spaced from a plurality of coplanar second conductors. The coplanar first conductors are spaced from each other by a first dielectric having a first dielectric constant. A set of the plurality of first conductors extend substantially parallel to each other at least for a portion of their run. The coplanar second conductors are spaced from each other by a second dielectric having a first dielectric constant. A set of the plurality of second conductors extend substantially parallel to each other and are separated by respective plurality of regions which reside in alignment directly above the set of plurality of first conductors, respectively. The dielectric structure which is interposed between the first conductors and the second conductors comprises a third dielectric of a first dielectric constant capped with a stress reducing oxide. The first dielectric constant is less than approximately 3.4.

BRIEF DESCRIPTION OF THE DRAWINGS

Other objects and advantages of the invention will become apparent upon reading the following detailed description and upon reference to the accompanying drawings in which:

FIG. 1 is a top plan view of a multilevel interconnect structure according to one embodiment of the present invention;

FIG. 2 is a cross-sectional view along plane 2 of FIG. 1;

FIG. 3 is a cross-sectional view along plane 3 of FIG. 1;

FIG. 4 is a detailed view along area 4 of FIG. 2;

FIG. 5 is a detailed view along area 5 of FIG. 3;

Figure 6:
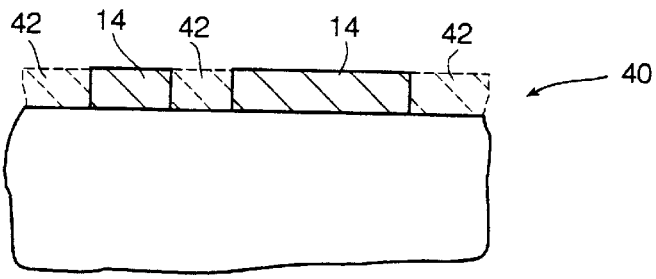
FIG. 6 is a cross-sectional view of a semiconductor topography along plane 2 showing formation of a first interconnect layer (i.e., a plurality of coplanar first conductors spaced from each other)

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 is a top plan view of a multilevel interconnect structure 10 according to one embodiment of the present invention. Structure 10 includes a semiconductor topography 12, upon which separate and distinct levels of interconnect are formed. There can be numerous levels of interconnect, each of which is separated by a dielectric structure, often referred to as an interlevel dielectric structure. According to the embodiment shown in FIG. 1, two levels of interconnect are shown for sake of brevity. A first level of interconnect comprises a set of coplanar first conductors 14, shown in dashed line. Dielectrically spaced above first conductors 14 is a set of second conductors 16. According to the present design, second conductors are laterally displaced from first conductors in a staggered configuration. To the extent certain portions of first and second conductors reside in vertical alignment directly above and below each other, a contact 18 is made. Contact 18 provides electrical communication between the first and second conductors.

In order to form contact 18, a select first conductor 14 must comprise a pad portion 20 which emanates, within the plane formed by the first set of conductors 14, from a sidewall of a first conductor 14. Accordingly, pad portion 20 extends perpendicular to an axis along which first conductor 14 predominantly extends. Pad portion 20 thereby comprises one portion of first conductor 14, the other portion being elongated portion 22. Contact 18 extends from the upper surface of pad portion 20 to the lower surface of second conductor 16. Accordingly, electrical conduction is formed between select first and second conductors 14 and 16.

Turning now to FIG. 2, a cross-section along plane 2 of FIG. 1 is shown. Specifically, FIG. 2 illustrates an interlevel dielectric structure 24 formed between first and second sets of conductors 14 and 16. Interlevel dielectric structure 24 comprises a low dielectric constant (low K) dielectric 28. According to one embodiment, structure 24 includes a capping dielectric 30a placed on the upper surface of low K dielectric 28. According to another embodiment, a capping dielectric 30b is placed on the lower surface of low K dielectric 28. According to yet another embodiment, capping dielectrics 30a and 30b are placed on both the upper and lower surfaces of low K dielectric 28.

Multilevel interconnect structure 10 shown in FIG. 2 further includes low K dielectrics 32 placed between first set of conductors 14, and a low K dielectric 34 placed between second set of conductors 16. Formation of low K dielectrics 28, 32 and 34, as well as capping dielectrics 30a and 30b, is illustrated in more detail in reference to FIGS. 6–14. There are various modifications and variations which can occur which form a desired multilevel interconnect structure 10, all of which would be obvious to a person skilled in the art having the benefit of this disclosure. Regardless of the modifications taken, multilevel interconnect structure 10 is formed having staggered interconnects placed upon semiconductor topography 12. Semiconductor topography 12 includes according to one embodiment a dielectric-covered substrate. According to another embodiment, topography 12 includes a dielectric-covered layer of conductors.

FIG. 3 illustrates a cross-sectional view along plane 3 of FIG. 1. Specifically, FIG. 3 depicts a cross-section removed from the area in which contact 18 occurs. The embodiment shown in FIG. 3 illustrates a larger spacing $D_2$ present between first conductors 14 than spacing $D_1$ shown in FIG. 2. The spacing differential is attributed to the presence and absence of pad portion 20. While a pad portion is necessary in a localized region to form the interlevel connection, a larger spacing $D_2$ is generally associated with spacing between first conductors 14. Thus, the horizontal spacing is generally maintained, except only in localized interlevel contact regions.

FIGS. 4 and 5 further depict cross-coupling brought about by fringing fields 36a and 36b. Fringing fields are attributed to parasitic capacitance between horizontally displaced first conductors 14. As noted in FIG. 4, fringing fields 36a are denser than fringing fields 36b in FIG. 5. This disparity is attributed to the greater spacing between first conductors 14 along essentially the entire run of that conductor except for localized regions. Accordingly, FIG. 5 illustrates a prime advantage in using localized pad portions of less than, for example, 1.0 micron per side. The remaining first conductor run is significantly spaced from the horizontally adjacent conductor, and is staggered from the overlying conductors, such that any fringing fields which are attributed between levels must occur in a diagonal path rather than a direct vertical path. The diagonal path is shown more clearly in FIG. 3 as being greater than a direct vertical path. A direct vertical path is one which exists between first and second conductors 14 and 16 vertically aligned with one another. However, instead of having a direct vertical path, the present layout entails offsetting (or staggering) the first and second conductors 14 and 16 such that they are both vertically and horizontally displaced, resulting in a relatively large diagonal path between the conductors.

Referring now to FIGS. 6–14, processing steps are shown for forming multilevel interconnect structure 10 according to one embodiment. The processing sequence uses various deposition and removal techniques, and also employs unique source materials for producing low K dielectrics and capping dielectrics having the advantages and features disclosed.

Turning now to FIG. 6, a cross-sectional view along plane 2 of FIG. 1 is shown during formation of first conductors 14. First conductors 14 are produced by depositing a layer of conductive material 40 and thereafter removing selective regions of the conductive material 42. Metal, such as aluminum, is the preferred conductive material. However, polysilicon may also be used, typically as the first layer of the multilevel interconnect structure. Deposition of the metal is preferably formed through sputter deposition, and select removal is carried out by lithography techniques and etch techniques.

Figure 7:
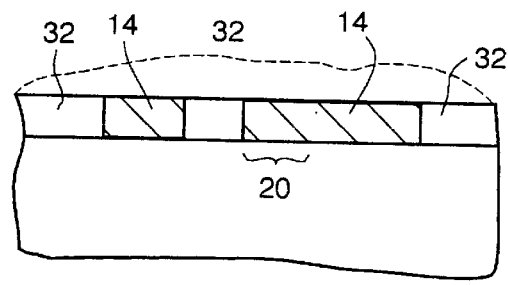
FIG. 7 is a cross-sectional view of a processing step subsequent to that shown in FIG. 6, wherein a first layer of dielectric of low dielectric constant is formed upon and between first conductors within the first interconnect layer.

FIG. 7 illustrates deposition of a low K dielectric 32 upon and between the patterned first conductors 14. Upper regions of low K dielectric are removed using, for example, a sacrificial etchback technique or a polish. Etch or polish is continued on the upper surface such that the remaining upper surface of dielectric 32 is substantially equal to the upper surface of first conductors 14.

A low K dielectric is one having a dielectric constant less than approximately 3.5. Dielectric constant is in many instances referred to as the permittivity of the dielectric material, and is designated above as e. According to one embodiment, dielectric 32 is spin-on deposited from, for example, an organic source material comprising polyimide, silicon sesquioxane, siloxane, hydrogen or organic groups such as methyl or phenyl added to siloxane. Spin on deposition is followed by a bake or cure step necessary to drive off solvents from the material. The bake step occurs possibly in two steps, a first step being at a low temperature (e.g., 150°–250° C.) followed by a higher temperature step (e.g., 350°–425° C.). The solvent is first driven off, and water is then evolved from the film which causes a considerable loss in mass and a substantial shrinkage of the deposited film. That shrinkage causes significant tensile stress within the resulting dielectric 32. If too thick a layer is applied, the stress can lead to film cracking. Fortunately, the film thickness need be only slightly thicker than first conductor 14, which is typically less than 1.0 micron in thickness.

An advantage in using spin-on materials is that they are able to fill small, high-aspect-ratio openings without occurrence of voids and their further ability of leaving a fairly planar upper surface across at least local regions if not the entire global area of a semiconductor wafer. In many instances, the low K dielectrics can have a dielectric constant or permittivity as low as 2.0 if they are carefully applied and cured. Given that dielectric 32 exists between first conductors 14, any moisture outgassing resulting from high temperature operation could generally be limited to conductor sidewalls and not upon the upper or lower surfaces of conductors where corrosion is more problematic. Accordingly, low K dielectric 32 is placed in critical areas between closely spaced first conductors 14. As shown in FIG. 7, the low K dielectric is placed between pad portion 20 of one first conductor and the laterally adjacent sidewall of another first conductor 14.

Figure 8:
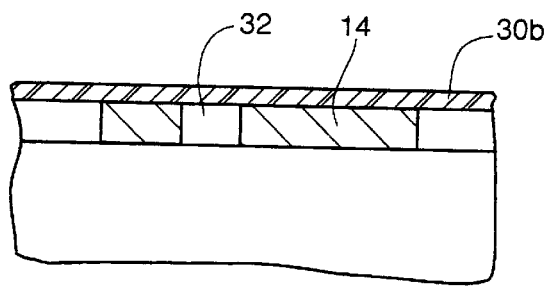
FIG. 8 is a cross-sectional view of a processing step subsequent to that shown in FIG. 7 wherein, according to one exemplary embodiment, a second dielectric (capping dielectric) of stress buffer capacity is formed upon the first dielectric.

FIG. 8 illustrates, according to one exemplary embodiment, a capping dielectric 30b deposited across low K dielectric 32 and first conductors 14. Capping dielectric 30b is preferably a silane-formed $SiO_2$ (oxide) film or, in the alternative, a TEOS-formed $SiO_2$. The oxide may have incorporated therein phosphorus to help reduce stress within the oxide and make the oxide more resistant to moisture which can originate from low K dielectric 32. Thus, capping layer 30b serves to offset the high intrinsic stress within low K dielectric 32 and thereby reduces the overall intrinsic stress of the interlevel dielectric structure.

Figure 9:
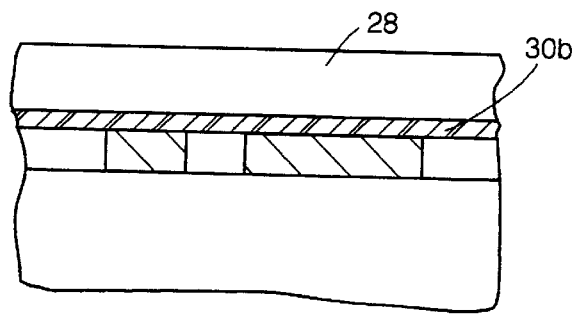
FIG. 9 is a cross-sectional view of a processing step subsequent to that shown in FIG. 8, wherein a third dielectric of low dielectric constant is formed upon the second dielectric.
Figure 10:
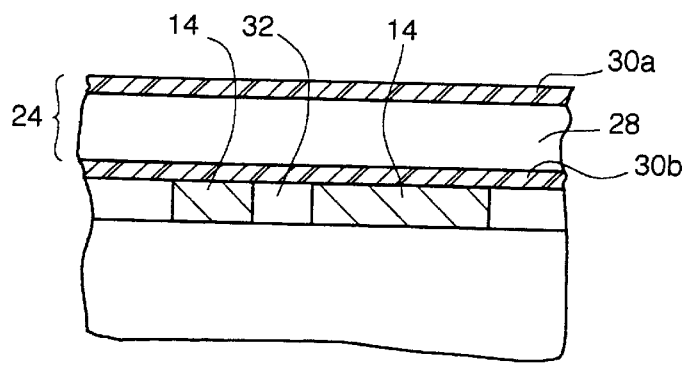
FIG. 10 is a cross-sectional view of a processing step subsequent to that shown in FIG. 9 wherein, according to one exemplary embodiment, a fourth dielectric (capping dielectric) of stress buffer capacity is formed upon the third dielectric.

FIG. 9 illustrates deposition of another low K dielectric 28 upon capping dielectric 30b. Low K dielectric 28 is similar to low K dielectric 32, in that it includes, for example, siloxane, polyimide, and carbon species placed within siloxane. Hydrogen silsesquioxane low K dielectric can have a final cure at a lower temperature between 250 to 400 degrees C., resulting in a dielectic constant of less than 3.0. This material may be spun directly on the metal. Spin on deposition of low K dielectric 28 helps further planarize the resulting topological surface in readiness for a capping layer 30a, if needed. Capping layer 30a is shown in reference to FIG. 10, and is similar to capping layer 30b. Capping layers 30a and 30b serve to minimize the overall intrinsic stress of the resulting interlevel dielectric structure 24, while sealing moisture away from first and second conductors 14 and 16. It is understood that the formation of interlevel dielectric 24 can take numerous deviations. For example, structure 24 need not contain capping layers 30a and 30b. In some instances, capping layers can be eliminated if the hygroscopic nature of low K dielectric is carefully controlled. For example, moisture retention and the corrosivity of moisture upon adjacent metal conductors is substantially reduced if the cure cycle is carefully controlled using a slow, ramped dehydration bake process hereof. For example, instead of a two-step curing cycle, the cure cycle can be ramped over a relatively long period of time, beginning at 150° C. up to almost the melting point of first conductor 14. Moreover, the dehydration bake process may be carried out over a longer time period exceeding, for example, 120 minutes to 160 minutes. The dehydration chamber is opened to a laminar air flow which more readily extracts moisture from the baked dielectric surface. The laminar air flow is preferably dry air which has been dehumidified and properly conditioned, possibly at an elevated temperature as it is drawn across the dielectric surface. Accordingly, dielectric structure 24 can forego capping layers if the aforementioned dehydration process is carefully followed. In order to maximize adhesion of a low K dielectric to a metallic conductor, the low K dielectric is coated with an adhesion-promoting layer, such as a nitride film prior to deposition of second conductors 16. There are various types of adhesion-promoting films. Whichever type of film is chosen, the film must be deposited at thicknesses less than 100 angstroms in order to not deleteriously affect the low dielectric constant afforded by dielectric 28.

As described, structure 24 can include no capping layers (neither 30a nor 30b), one capping layer (either 30a or 30b), or both capping layers (30a and 30b). Presence or absence of capping layers is dependent upon the process sequence used in forming low K dielectric 28 as well as low K dielectric 32. Generally speaking, it is often necessary to have at least one capping layer. If one capping layer is chosen, then it is desirable to have capping layer 30a more so than capping layer 30b. For example, capping layer 30a serves not only as a sealant against moisture ingress upon second conductor 16, but also serves to prevent thermal expansion mismatches between low K dielectric 28 and second conductor 16. Yet further, capping layer 30a serves somewhat as an etch resist material necessary when patterning second conductor 16. Absent capping dielectric 30a, and the benefits of a CVD oxide used in forming a capping layer, low K dielectric 28 readily etches in an oxygen, fluorine, or carbon-based plasma used for patterning metal films. Capping dielectric 30a thereby serves as an etch-stop material under the metal layer to prevent low K dielectric 28 erosion.

Figure 11:
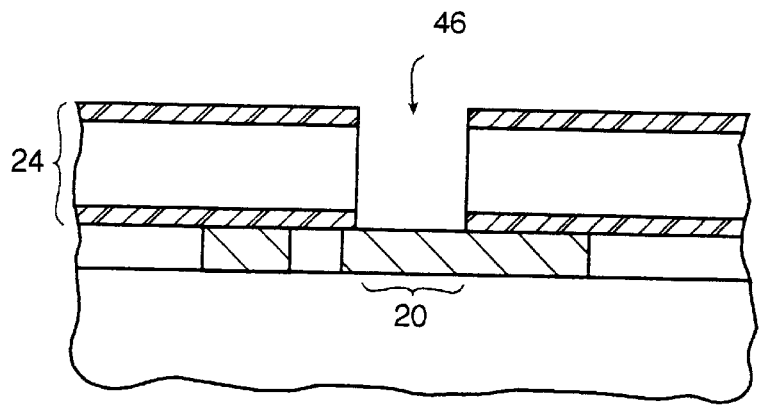
FIG. 11 is a cross-sectional view of a processing step subsequent to that shown in FIG. 9, wherein a via is formed through the second, third and fourth dielectrics to at least one of the first conductors.
Figure 12:
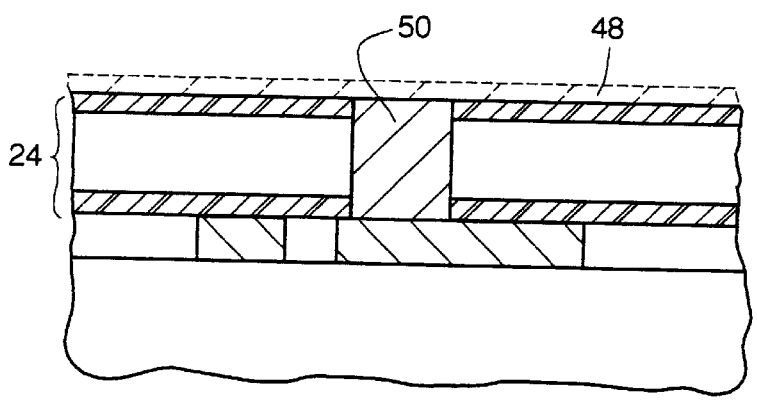
FIG. 12 is a cross-sectional view of a processing step subsequent to that shown in FIG. 11, wherein a contact is formed within the via according to an exemplary damascene process.

Turning now to FIG. 11, a via 46 is formed through structure 24 to the upper surface of pad portion 20. Via 46 is of any size and aspect ratio which can be filled in a subsequent metal deposition step, shown in FIG. 12. Deposition of a metal layer 48 is shown in FIG. 12, and thereafter subsequently removed as shown by dashed area 48. The retained material is presented as a contact 50 within via 46. Contact 50 is formed by removing metal upper surface 48 to an elevational level at or slightly below the upper surface of structure 24. The preferred metal material used in forming contact 50 comprises tungsten. Tungsten is chosen since it readily fills, through chemical vapor deposition, via 46.

Figure 13:
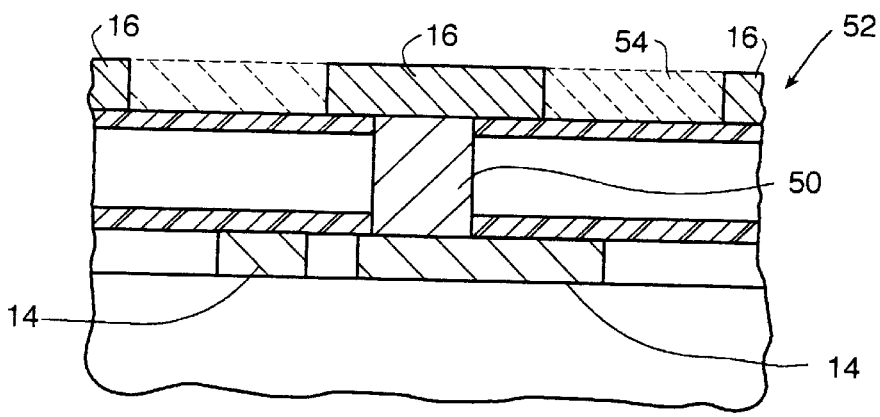
FIG. 13 is a cross-sectional view of a processing step subsequent to that shown in FIG. 12, wherein a second interconnect layer (i.e., a plurality of coplanar second conductors spaced from each other) is formed upon the contact and across select regions of the fourth dielectric.

FIG. 13 illustrates deposition of second conductive material 54 upon structure 24. Removed regions 54 are produced by lithography to produce coplanar second conductors 16. At least one of second conductors 16 abuts with and is in electrical communication with contact 50 and a select one of underlying first conductors 14.

Figure 14:
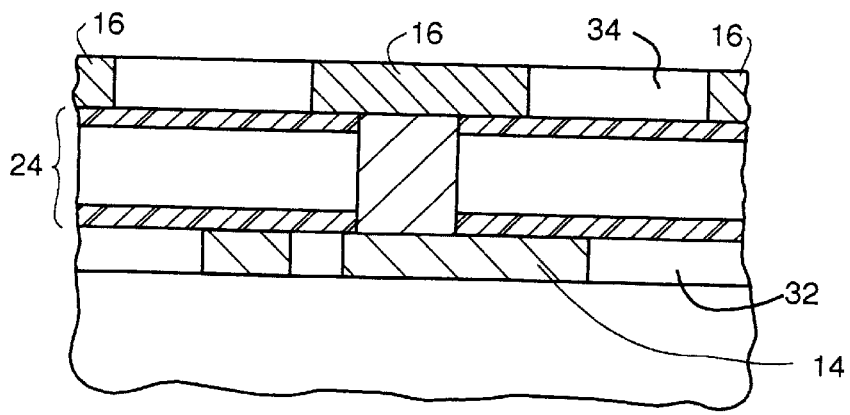
FIG. 14 is a cross-sectional view of a processing step subsequent to that shown in FIG. 13, wherein a fifth dielectric of low dielectric constant is formed upon and between the second conductors within the second interconnect layer.

FIG. 14 illustrates a processing step whereby low K dielectric 34 is deposited and subsequently planarized such that it exists in regions between second conductors 16. Formation of low K dielectric 34 is similar to the formation of low K dielectric 32. In that it exists in the horizontally spaced regions between conductors, dielectric 34 serves to reduce fringing fields between the coplanar conductors. FIG. 14 thereby depicts the completed multilevel interconnect structure 10 of FIG. 1 having an interlevel dielectric structure 24 formed by a single low K dielectric and one (or two) capping dielectrics. Dielectric structure 24, as well as intralevel dielectrics 32 and 34, provides optimal electrical isolation of signals forwarded through first and second conductors 14 and 16, respectively. The low dielectric constant or permittivity of select layers formed in critical regions, and the staggering of first and second conductors relative to one another affords a high density interconnect configuration but without increasing parasitic capacitance problems.

It will be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for forming a multilevel interconnect structure, comprising:

forming a first conductor upon a semiconductor topography, wherein said first conductor comprises an elongated portion and a pad portion extending coplanar with the elongated portion along an axis perpendicular to the elongated portion;

spin on depositing an organic material upon said first conductor and thereafter curing said organic material to form a first dielectric having a dielectric constant less than 3.5;

depositing a silane or TEOS based material upon said first dielectric to form a second dielectric;

etching through select regions of said first and second dielectrics to only said pad portion of the first conductor to form a via;

filling said via with a metallic material to form a contact having an upper surface commensurate with an upper surface of said second dielectric; and forming a second conductor in a region directly above said pad portion in electrical communication with said contact.

2. The method as recited in claim 1, wherein said second conductor extends along an axis which is laterally offset from and parallel to an axis along which said elongated portion extends.

3. The method as recited in claim 1, wherein said filling comprises depositing said metallic material within said via and thereafter removing an upper surface of said metallic material to an elevational level equal with the upper surface of said second dielectric.

4. The method as recited in claim 3, wherein said depositing comprises chemical vapor depositing.

5. The method as recited in claim 3, wherein said filling comprises polishing.

6. The method as recited in claim 1, wherein said etching comprises plasma etching with a fluorocarbon species.

7. The method as recited in claim 1, wherein said spin on depositing comprises spin on depositing a polyimide.

8. The method as recited in claim 1, wherein said spin on depositing comprises spin on depositing a siloxane, hydrogen, or methyl silicon sesquioxane.

9. The method as recited in claim 1, wherein said spin on depositing comprises depositing said organic material on the sidewalls of said first conductor.

10. The method as recited in claim 1, further comprising depositing a silane based material upon said first conductor prior to said spin on depositing an organic material.

* * * * *